United States Patent
Harden et al.

(10) Patent No.: US 6,702,592 B1
(45) Date of Patent: Mar. 9, 2004

(54) PRINTED CIRCUIT BOARD ASSEMBLY WITH SECONDARY SIDE RIGID ELECTRICAL PIN TO MATE WITH COMPLIANT CONTACT

(75) Inventors: Brian L. Harden, Norman, OK (US); Leon J. Valley, Piedmont, OK (US); Alvin E. Cox, Yukon, OK (US)

(73) Assignee: Seagate Technology LLC, Scotts Valley, CA (US)

( * ) Notice: Subject to any disclaimer, the term of this patent is extended or adjusted under 35 U.S.C. 154(b) by 542 days.

(21) Appl. No.: 09/690,526

(22) Filed: Oct. 16, 2000

Related U.S. Application Data
(60) Provisional application No. 60/169,012, filed on Dec. 3, 1999.

(51) Int. Cl.$^7$ ................................................ H02K 11/00
(52) U.S. Cl. ..................... 439/78; 439/507; 439/948; 439/926; 310/71
(58) Field of Search ..................... 439/78, 83, 289, 439/507, 948, 926; 310/71; 360/99.08, 98.07

(56) References Cited

U.S. PATENT DOCUMENTS

| | | | |
|---|---|---|---|
| 3,366,919 A | | 1/1968 | Gammel, Sr. et al. |
| 3,715,706 A | | 2/1973 | Michel et al. |
| 4,274,700 A | * | 6/1981 | Keglewitsch |
| 4,482,937 A | * | 11/1984 | Berg |
| 4,509,811 A | | 4/1985 | Amano et al. |
| 4,695,108 A | | 9/1987 | Ichitsubo |
| 4,752,244 A | | 6/1988 | Kuhl et al. |
| 4,752,246 A | | 6/1988 | Triner et al. |
| 4,755,147 A | | 7/1988 | Young |
| 4,761,881 A | | 8/1988 | Bora et al. |
| 4,846,705 A | * | 7/1989 | Brunnenmeyer ............. 439/78 |
| 4,858,044 A | | 8/1989 | Crapo |
| 4,871,317 A | | 10/1989 | Jones |
| 4,893,216 A | | 1/1990 | Hagner |
| 4,905,110 A | | 2/1990 | Krum et al. |
| 4,909,746 A | * | 3/1990 | Scholz ........................ 439/82 |
| 4,919,970 A | | 4/1990 | Hoebener et al. |
| 4,965,686 A | | 10/1990 | Young et al. |
| 5,015,893 A | | 5/1991 | Shiozawa |
| 5,083,939 A | | 1/1992 | Ittah |
| 5,212,607 A | | 5/1993 | Elsing et al. |
| 5,256,922 A | | 10/1993 | Tanaka et al. |
| 5,269,693 A | * | 12/1993 | Sekine ........................ 439/74 |
| 5,295,028 A | | 3/1994 | Elsing |
| 5,337,202 A | | 8/1994 | Jabbarai et al. |
| 5,352,947 A | | 10/1994 | MacLeod |
| 5,357,386 A | | 10/1994 | Haidari et al. |
| 5,403,202 A | | 4/1995 | Roehling |
| 5,541,787 A | | 7/1996 | Jabbari et al. |
| 5,541,788 A | | 7/1996 | Ishida et al. |
| 5,548,458 A | | 8/1996 | Pelstring et al. |
| 5,572,384 A | | 11/1996 | Kumagai et al. |
| 5,626,278 A | | 5/1997 | Tang |
| 5,655,285 A | | 8/1997 | Bonn et al. |
| 5,659,213 A | | 8/1997 | Imashiro et al. |
| 5,661,352 A | * | 8/1997 | Oguchi et al. ................ 310/71 |
| 5,705,868 A | | 1/1998 | Cox et al. |
| 5,717,541 A | | 2/1998 | Yeas et al. |
| 5,743,457 A | | 4/1998 | Benedette et al. |
| 5,920,461 A | | 7/1999 | Brune |

FOREIGN PATENT DOCUMENTS

| | | |
|---|---|---|
| JP | 6215530 A | 5/1994 |
| JP | 7245898 A | 9/1995 |
| JP | 408106743 A | 4/1996 |

\* cited by examiner

*Primary Examiner*—Neil Abrams
(74) *Attorney, Agent, or Firm*—Fellers, Snider, et al.

(57) ABSTRACT

An improved interconnection assembly is disclosed suitable for use, for example, in completing an electronic signal path between a printed circuit board (PCB) and an internal component within a head disc assembly (HDA) of a disc drive. The (PCB) has a primary side suitable for mounting surface mount devices and a secondary side facing a basedeck of the disc drive. The interconnection assembly comprises a conductive pin provisioned within a pin aperture in the PCB and a connector provisioned within a connector aperture in the HDA. The pin is inserted and secured within the pin aperture using primary side operations. A distal end of the conductive pin includes an electrical contact surface at the distal extent of the pin and which intersects an axis of insertion in the pin aperture. The electrical contact surface contacts the connector when the PCB is mated with the HDA.

30 Claims, 6 Drawing Sheets

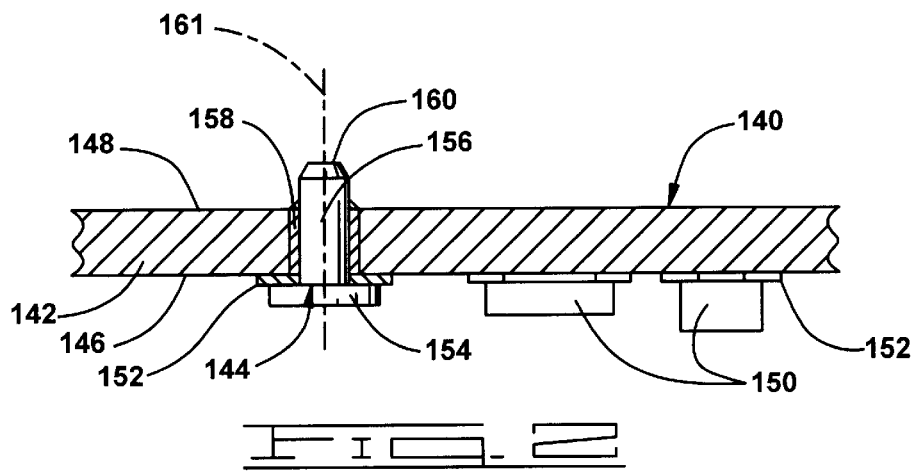
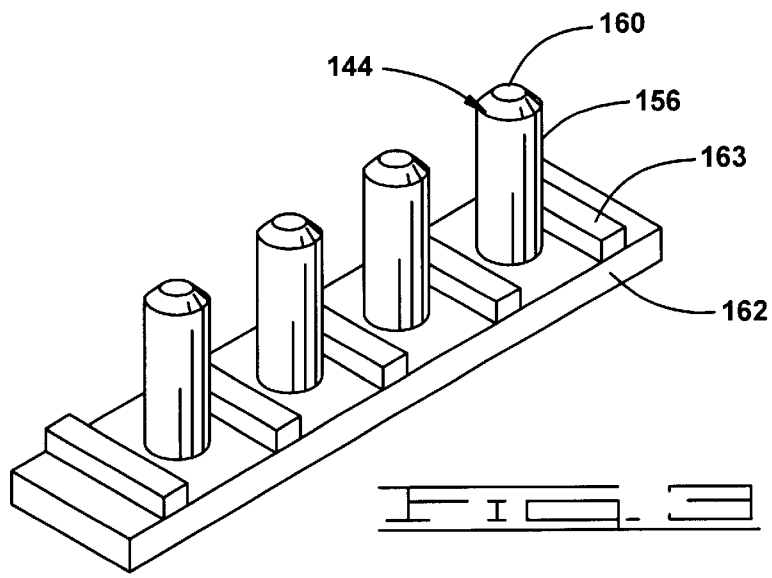
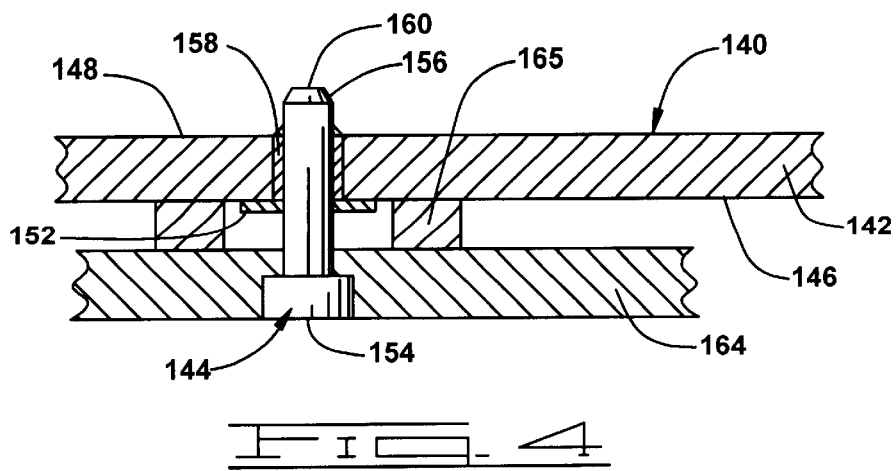

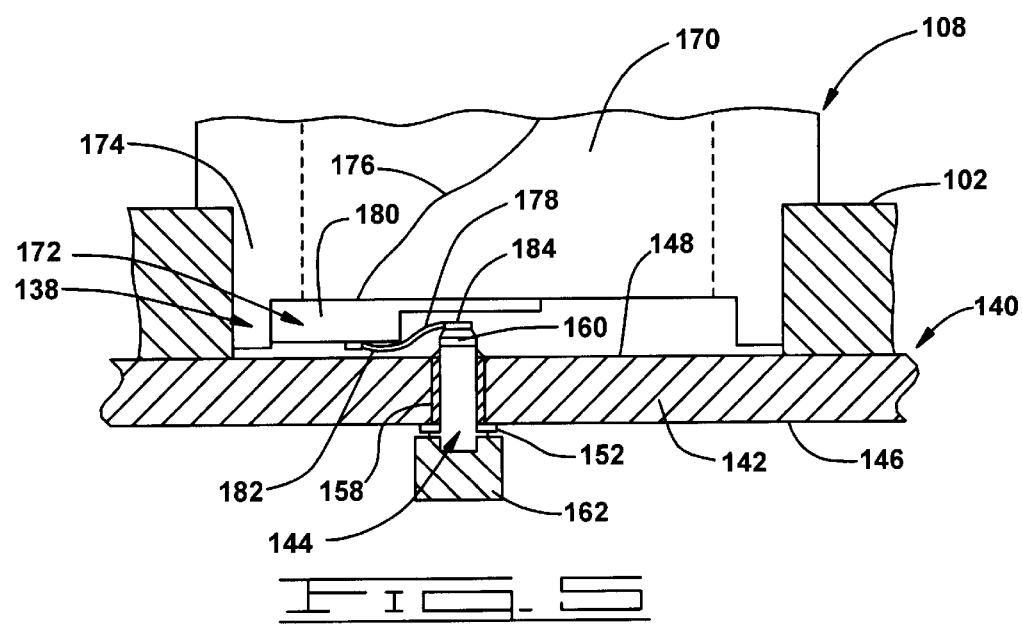
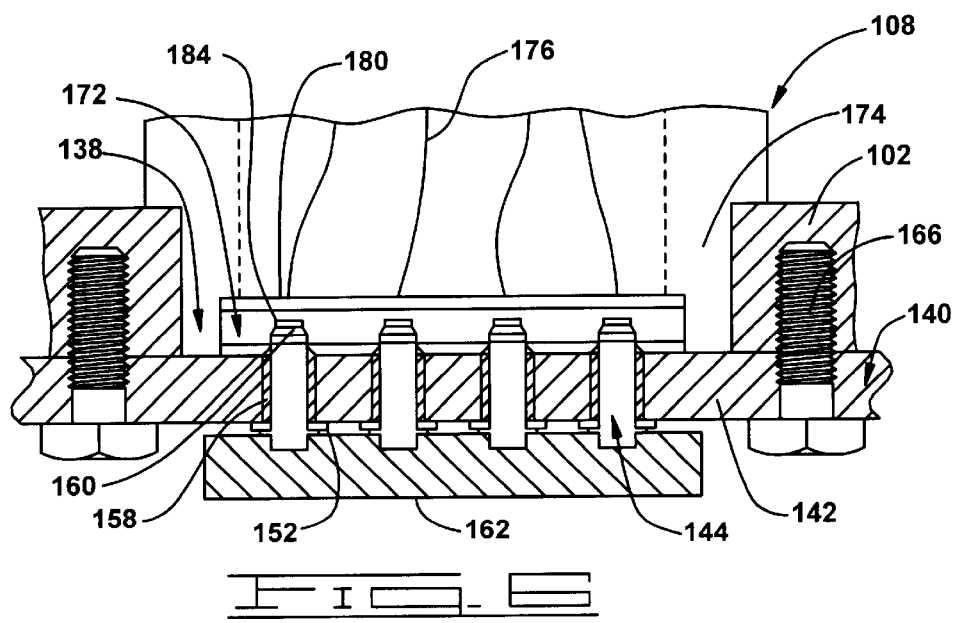

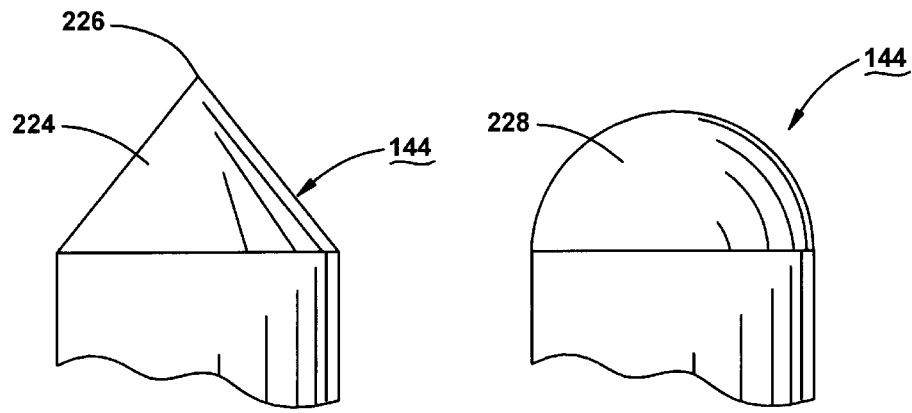
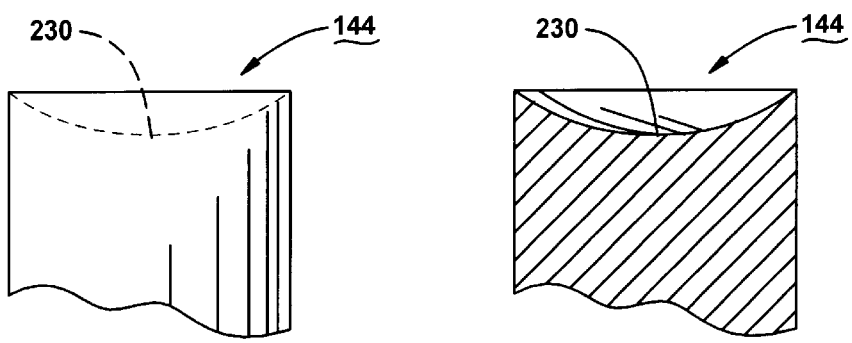
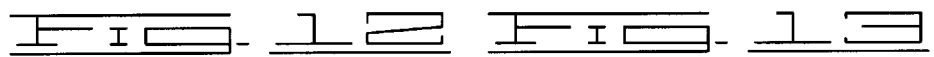

PRINTED CIRCUIT BOARD ASSEMBLY WITH SECONDARY SIDE RIGID ELECTRICAL PIN TO MATE WITH COMPLIANT CONTACT

RELATED APPLICATIONS

This application claims priority to Provisional Application No. 60/169,012 filed Dec. 3, 1999.

FIELD THE INVENTION

This invention relates generally to the field of magnetic data storage devices, and more particularly, but not by way of limitation, to a method and apparatus for electrically interconnecting conductive traces on a printed circuit board assembly to an internal component housed within the head disc assembly.

BACKGROUND

Disc drives are used as primary data storage devices in modern computer systems and networks. A typical disc drive includes a head-disc assembly (HDA) and an attached printed circuit board assembly (PCBA). The HDA is an enclosed structure comprising a basedeck which supports one or more rigid magnetic storage discs that are journaled about a rotary hub of a spindle motor to form a disc stack. An array of read/write transducing heads are supported adjacent the disc stack by an actuator to transfer data via read/write circuitry provisioned on the PCBA to a host computer in which the disc drive is mounted. The PCBA includes a printed circuit board (PCB) upon which are mounted a plurality of electrical components. Modern PCBA's make use of surface mount device technology in which electrical components are mounted to a single, "primary" side of the PCB without the need for through-hole insertion or two-sided manufacturing operations. The PCB also has a secondary side which, when mounted to the HDA, faces the basedeck.

Conventional actuators employ a voice coil motor to position the heads with respect to the disc surfaces. The heads are mounted via flexures at the ends of a plurality of arms which project radially outward from an actuator body. In addition to the read/write heads, the actuator assembly generally includes head wires, which conduct electrical signals from the read/write heads to a flex circuit that, in turn, conducts the electrical signals to a read/write channel located on the PCBA. Normally, the electrical signal paths are routed through one or more connectors en route to the read/write channel.

The actuator body pivots about a shaft mounted to the disc drive housing at a position closely adjacent the outer extreme of the discs. The pivot shaft is parallel with the axis of rotation of the spindle motor and the discs, so that the heads move in a plane parallel with the surfaces of the discs. The pivotal movement of the actuator is controlled by selectively energizing the voice coil motor which operates in accordance with the well-known Lorentz relationship. Typically, servo circuitry located on the PCBA sends signals to the voice coil motor along the same flex assembly used to transfer read/write information to and from the heads.

The spindle motor comprises a brushless direct current ("dc") motor having a stationary stator with a plurality of electrical phases, each phase having one or more sets of electrical windings that are wrapped around poles within the stator, with the sets of windings in each phase being electrically connected in series. The spindle motor includes a rotor mounted for rotation about the stator, with the rotor having a plurality of permanent magnets and an outer hub to which the discs are mounted. By selectively energizing the windings within each phase in the stator, magnetic fields are generated in the windings which interact with the magnetic fields of the rotor magnets, causing the discs to rotate in the desired direction at the desired speed. Typically, three or four signal wires are used to control the function of the spindle motor.

As mentioned above, both spindle motor and actuator circuitry are typically provisioned on the PCBA mounted to the underside of the HDA. Because it is necessary to maintain a sealed environment within the HDA, the connectors and signal paths between the PCBA and components within the HDA are designed to eliminate the exposure of internal components.

Traditionally, disc drive designers have used a three connector combination which includes a connector internal to the HDA, a pass through connector mounted adjacent the basedeck and a third connector mounted on the secondary side of the PCB. Under this scheme, the connector internal to the HDA is a fixed adapter that is attached to either the flex circuit assembly or the spindle motor. The pass through connector houses pins that mate with the internal connector within the HDA and pins that protrude through an aperture or slot in the basedeck. The third component, a free connector mounted on the secondary side of the PCB, receives the pins protruding from within the basedeck. U.S. Pat. No. 5,212,607 issued to Elsing et al. and assigned to the assignee of the present application provides a thorough discussion of a three-connector scheme.

Despite its simplistic function, the traditional three-connector scheme requires that a free adapter be placed on the secondary side of the PCB. With the availability of surface mount device technology, it has become cost inefficient to provision components on both surfaces of a PCB during manufacture. As such, it has become necessary to develop an effective means of providing communication between the HDA and the PCB without mounting components to both sides of the PCB.

One solution involves connecting a flex circuit to the internal component and feeding the flex circuit between the basedeck and the attached top cover. The flex circuit is then routed along the outside of the HDA and onto a connector mounted on the primary side of the PCB. An example of this approach is disclosed in U.S. Pat. No. 5,403,202 issued to Roehling. The disadvantage of this external feed approach is the exposure of the flex circuit to handling damage during the assembly process, customer installations and in automated production processes. The production difficulties arise when trying to locate, secure and connect the non-rigid flex circuit via automated means.

Another solution entails forming apertures in the basedeck and PCB and securing the internal component to the basedeck such that a portion of the internal component extends through the apertures in the basedeck and PCB. A connector mounted on the primary side of the PCB is then used to engage the exposed internal component. Such a design is disclosed in U.S. Pat. No. 5,705,868 issued to Cox et al. ("Cox '868") which is commonly assigned with this application. Cox '868 teaches a spindle motor that extends through the basedeck and PCB and a surface-mounted connector which engages the fixed pins of the spindle motor. Although Cox '868 eliminates the need for mounting components to the secondary-side of the PCB, the connector is relatively complex and potentially expensive to manufacture.

Accordingly, there is a continued need for a cost-effective means for providing an electrical connection path between the PCBA and an internal component housed within the HDA.

SUMMARY OF THE INVENTION

The present invention is directed to an improved interconnection assembly for completing an electronic signal path between a printed circuit board assembly and an internal component within a head disc assembly of a disc drive. The printed circuit board assembly includes a printed circuit board which has a primary side suitable for mounting surface mount devices and a secondary side facing a basedeck of the disc drive.

The interconnection assembly comprises a conductive pin provisioned within a pin aperture in the printed circuit board and a fixed connector provisioned within a connector aperture in the basedeck. The pin is inserted and secured within the pin aperture using primary side assembly operations. A distal end of the conductive pin extends beyond the secondary side of the printed circuit board, thereby forming a secondary side electrical contact. The secondary side electrical contact is engaged with the connector while mounting the printed circuit board assembly to the head disc assembly.

These and other features and advantages which characterize the present invention will be apparent from a reading of the following detailed description and a review of the associated drawings.

BRIEF DESCRIPTION OF THE DRAWINGS

FIG. 2 is cross-sectional view of a printed circuit board assembly and secondary side electrical contact constructed in accordance with preferred embodiments of the present invention.

FIG. 3 is a perspective view of a plurality of conductive pins ganged together forming a plurality of secondary side electrical contacts.

FIG. 4 is cross-sectional view of a printed circuit board, conductive pin and spacer constructed in accordance with preferred embodiments of the present invention.

FIG. 6 is a front cross-sectional view the interconnection depicted in FIG. 5.

FIG. 9 is a graphical flowchart representing a preferred method for electrically interconnecting the head disc assembly to the printed circuit board assembly.

FIG. 10 provides an alternative embodiment for the secondary side electrical contact pin of FIG. 2, the embodiment of FIG. 10 employing a pointed contact surface.

FIG. 11 provides another alternative embodiment for the secondary side electrical contact pin, the embodiment of FIG. 11 employing a convex contact surface.

FIG. 12 provides yet another alternative embodiment for the secondary side electrical contact pin, the embodiment of FIG. 12 employing a concave contact surface.

FIG. 13 provides a cross-sectional view of the pin of FIG. 12.

DETAILED DESCRIPTION

Figure 1:
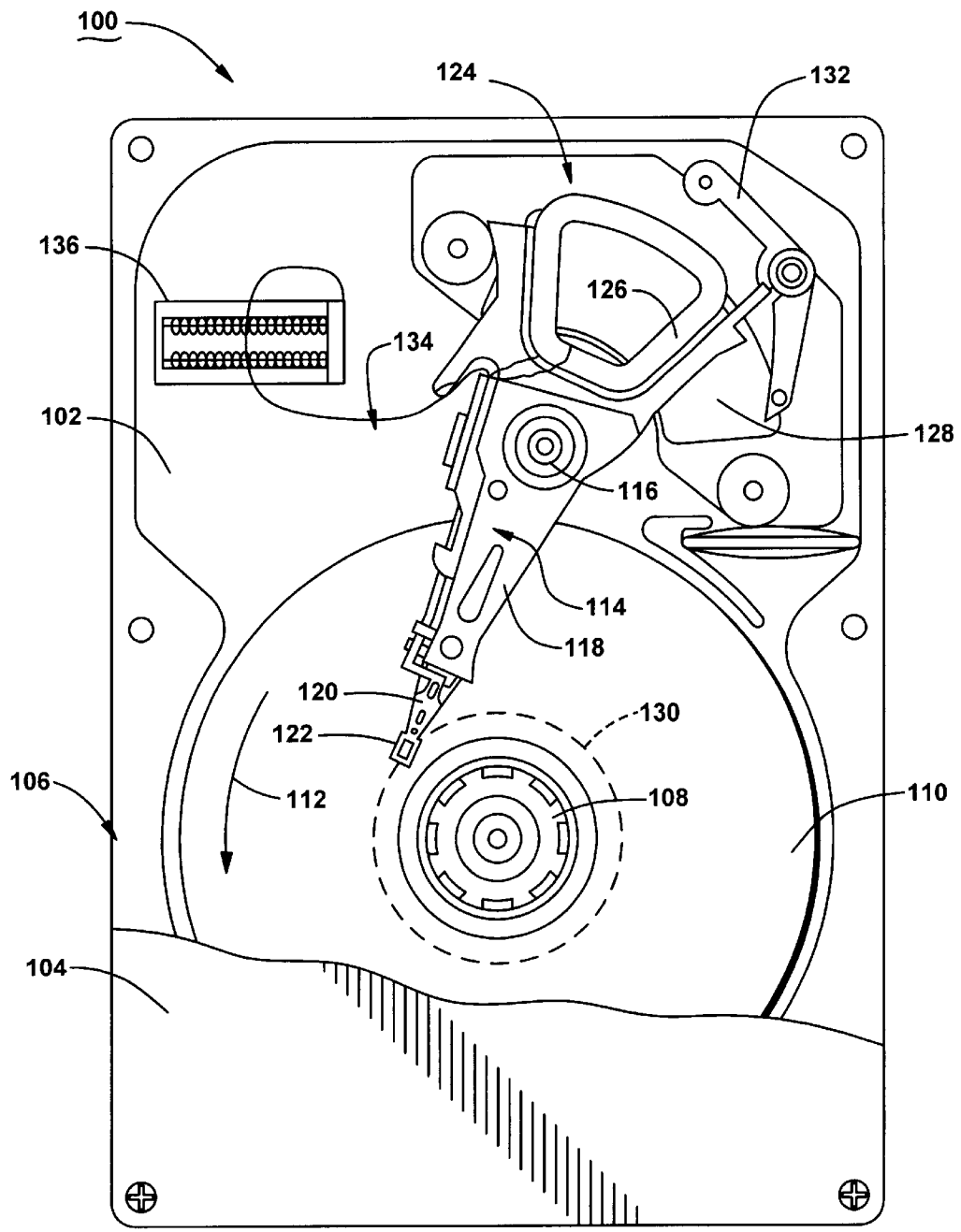
FIG. 1 is a top plan view of a disc drive constructed in accordance with preferred embodiments of the present invention.

In order to provide a detailed description of various preferred embodiments of the present invention, reference is first made to FIG. 1, which provides a top plan view of a disc drive 100 of the type used to interface with a host computer to magnetically store and retrieve user data. The disc drive 100 includes abase deck 102 to which various components of the disc drive 100 are mounted. A top cover 104 (shown in partial cutaway fashion) cooperates with the base deck 102 to form an internal, sealed environment for the disc drive. Collectively, the base deck 102, the top cover 104 and all internal components of the disc drive 100 are referred to as the head disc assembly ("HDA") 106.

A spindle motor (shown generally at 108) is provided to rotate a plurality of axially-aligned, rigid, magnetic recording discs 110 at a constant velocity (in thousands of revolutions per minute) as indicated by vector 112. User data are written to and read from tracks (not designated) on the discs 110 through the use of an actuator assembly 114, which rotates about a bearing shaft assembly 116 positioned adjacent the discs 110.

The actuator assembly 114 includes a plurality of rigid actuator arms 118 which extend toward the discs 110. A plurality of flexible suspension assemblies 120 are attached to the distal end of the actuator arms 118. Mounted at the distal end of each of the flexible suspension assemblies 120 is a head 122 which includes a slider assembly (not separately designated) designed to fly in close proximity to the corresponding surface of the associated disc 110. The heads 122 are preferably characterized as magneto-resistive (MR) heads each having a thin-film inductive write element and an MR read element.

For reference, it will be understood that the radial position of the heads 122 is controlled through the use of a voice coil motor (VCM) 124, which includes a coil 126 as well as a permanent magnet 128 which establishes a magnetic field in which the coil 126 is immersed. A second magnetic flux path is disposed above the permanent magnet 128, but has not been shown for purposes of clarity. The heads 122 are moved across the surfaces of the discs 110 through the application of current to the coil 126. When the disc drive 100 is not in use, the heads 122 are moved over and come to rest upon landing zones 130 near the inner diameter of the discs 110 and the actuator assembly 114 is secured using a magnetic latch assembly 132. A flex assembly 134 provides the requisite electrical connection paths for the actuator assembly 114 while allowing pivotal movement of the actuator assembly 114 during operation.

The flex assembly 134 is connected to a flex circuit connector 136 which is provisioned within a connector aperture 138 (not visible in FIG. 1) in the basedeck 102. It will be recognized that connector apertures 138 may be used for other internal components, such as for example, the spindle motor 108, and is not specific to the flex assembly 134. The flex circuit connector 136 provides an electrical interconnection between the HDA 106 and a printed circuit board assembly ("PCBA") 140 which is mounted to the underside of the HDA 106 and, as such, is not visible in the top view provided by FIG. 1.

Turning now to FIG. 2, shown therein is a side cross-sectional view of the PCBA 140 and an affixed conductive pin 144. The PCBA 140 includes a printed circuit board ("PCB") 142 which is preferably configured for surface mount device technology and has a primary side 146 and a secondary side 148. Use of surface mount device technology increases production efficiency by eliminating the need for secondary side 148 operations during manufacture. Additionally, the absence of components on the secondary side 148 facilitates handling and improves the durability of the PCBA 140.

During manufacture, electrical components 150 are provisioned to solder pads 152 located on the primary side 146. However, when attached to the basedeck 102 of the disc drive 100, the PCBA 140 is inverted and the primary side 146 becomes the bottommost surface of the disc drive 100. The depiction of the PCB 142 in FIG. 2 reflects the inverted position of the PCBA 140 as encountered in a fully assembled disc drive 100.

The pin 144 includes a proximal end 154 that is electrically and rigidly connected to the solder pads 152 on the primary side 146 of the PCB 142. A medial portion 156 of the conductive pin 144 is retained within a conductive plated through-hole 158 (also referred to herein as a "pin aperture") that provides an electrical connection between the pin 144 and conductive traces layered within the PCB 142 (not shown in FIG. 2). In a preferred embodiment, the diameter of the proximal end 154 of the pin 144 is selected to be nominally larger than the diameter of the plated throughhole 158 to prevent over-insertion of the pin 144.

A distal end of the pin 144 protrudes a prescribed distance beyond the secondary side 148 of the PCB 142, thereby providing a secondary side electrical contact 160 (also referred to herein as an "electrical contact surface"). The amount of protrusion beyond the secondary side 148 depends upon the space between the PCB 142 and the basedeck 102 and the physical dimensions of the connector. In typical applications, the desired protrusion may be within the range of 0.02 to 2.54 cm (0.02 to 0.1 in.).

Because the secondary side electrical contact surface 160 of the pin 144 serves as a contact point, the secondary side electrical contact surface 160 is preferably coated with a highly conductive plating, such as gold, gold alloy, or lead/tin composites. Additionally, the geometry of the distal end 160 should be selected for facilitated engagement with the connector. Preferred configurations for the secondary side electrical contact 160 include convex, concave, flat or pointed. As shown in FIG. 2, the secondary side electrical contact surface 160 is disposed at the distal extent of the pin 144 and intersects a central axis (denoted by broken line 161) along which the pin 144 is inserted into the pin aperture 158.

In most applications, a plurality of signals are transferred between a component located inside the HDA 106 (either the flex circuit assembly 134 or the spindle motor 108) and the PCB 142. As such, a plurality of pins 144 are required to complete the signal paths.

FIG. 3 shows a perspective view of a plurality of pins ganged together and anchored by a pin block 162. The pin block 162 is preferably fabricated from a dielectric material that efficiently dissipates heat. The pins 144 may be ganged together in a linear, staggered or matrix configuration. Additionally, the physical dimensions of the pin block 162 should not restrict the exposure of the solder pads 152 to the heat source during soldering operations. The pin block 162 also serves as an effective handle or suction surface during robotic manufacture of the PCB 142. The pin block 162 includes a number of fixed spacer tabs 163 interposed between adjacent pins 144 to permit access to the solder pads 152 and establish the final distal extent of the contact surface 160.

Turning now to FIG. 4, shown therein is a side crosssectional view of an alternative pin block 164 in conjunction with a selectably sized spacer 165. The spacer 165 comprises a dielectric ring having an inner diameter nominally larger than the outer diameter of the medial portion 156 of the pin 144. The spacer 165 is useful for adjusting the amount of protrusion exhibited by the distal end 160 of the pin 144 from beyond the secondary side 148 of the PCB 142. By adjusting the protrusion of the pin 144 with the spacer 165, uniform pins 144 can be employed in a variety of applications. The use of uniform pins 144 reduces the overall cost of manufacturing by lowering the cost of materials and simplifying the automated production of the PCB 142.

Figure 5:
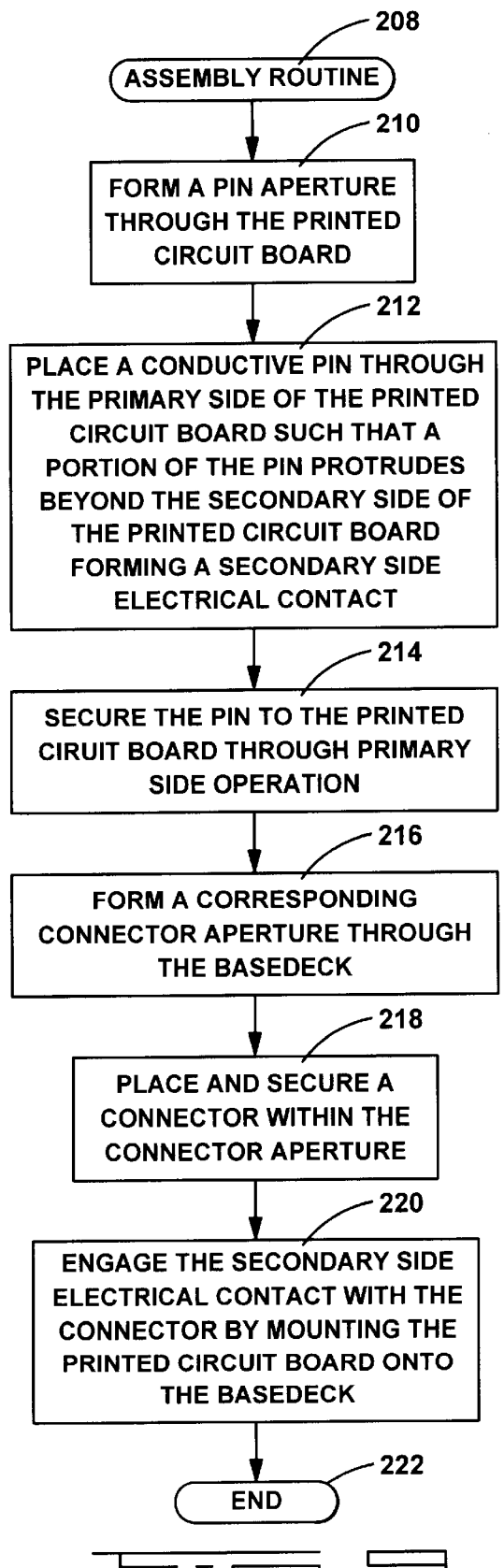
FIG. 5 is a side cross-sectional view showing the interconnection of the secondary side electrical contacts of FIG. 3 with a first preferred embodiment of the connector of the spindle motor of FIG. 1.

FIG. 5 shows a side cross-sectional view of a first preferred interconnection between the PCBA 140 and the spindle motor 108. As described above, the PCB 142 includes a plated through-hole 158 through which a pin 144 is inserted. The pin 144 is rigidly and electrically connected to solder pads 152 on the primary side 146 of the PCB 142. The PCBA 140 is mounted to the basedeck 102 with mounting screws (not shown in FIG. 5). As desired, a vibro-acoustic pad (not shown) can be provisioned between the PCB 142 and basedeck 102 to reduce mechanical noise and vibration during operation of the disc drive 100. Preferably, the vibro-acoustic pad is fabricated from closed cell foam or other suitable plastic.

The spindle motor 108 includes a shaft 170, a springflexure connector 172 and a base portion 174. The base portion 174 retains the spring-flexure connector 172 and is secured within the connector aperture 138 in the basedeck 102, thereby sealing the internal environment of the HDA 106. Preferably, the base portion 174 is machined for threaded engagement with the connector aperture 138 in the basedeck. Other means of securing the base portion 174 within the connector aperture 138 include strong adhesives, screws and retaining flanges.

The spring flexure connector 172 receives the pin 144 and provides a signal path between the pin 144 and coil wires 176 which extend through the base portion into the spindle shaft 170. Although not depicted in FIG. 5, the coil wires 176 form the signal path to the windings that supply the electromotive force for the spindle motor 108.

The spring-flexure connector 172 includes a conductive flexure 178 that is supported by a dielectric connector frame 180. The conductive flexure 178 is preferably constructed from a pre-formed metal strip that exhibits a spring resistance to deformation. The conductive flexure 178 has a fixed portion 182 that is captured by the connector frame 180 and a moveable contact portion 184.

When engaged by the pin 144, the contact portion 184 of the conductive flexure 178 deflects slightly, creating a spring force that ensures a solid electrical contact. By permitting a limited degree of movement, the conductive flexure 178 controls the contact vertical force exerted by the pin 144. To ensure proper deflection during operation, the pin 144 should not cause the conductive flexure 178 to bend to such an extent that the conductive flexure 178 is in contact with the dielectric connector frame 180. It will be understood that alternative configurations for the spring-flexure connector 172 are known and are considered within the scope of the present invention.

Turning now to FIG. 6, shown therein is a front crosssectional view of the interconnection of the PCBA 140 and spindle motor 108 depicted in FIG. 5. The aforementioned mounting screws used to secure the PCB 142 to the base deck 102 are identified at 166. From FIG. 6, it is apparent that four pins 144 are used to transfer signals from the spindle motor circuitry located on the PCB 142 to the spindle motor coils along individual coil wires 176. FIG. 6 also demonstrates the tolerance provided between the contact portion 184 and the dielectric connector frame 180.

Although FIG. 6 depicts four pins 144, it will be understood that alternative numbers of pins may be used and are considered within the scope of the present invention. It will also be understood that, although reference in FIG. 5 and FIG. 6 is made to the spindle motor 108, the pin and spring flexure combination could be used to interconnect other components internal to the HDA 106, such as, for example, the flex assembly 134.

Figure 7:
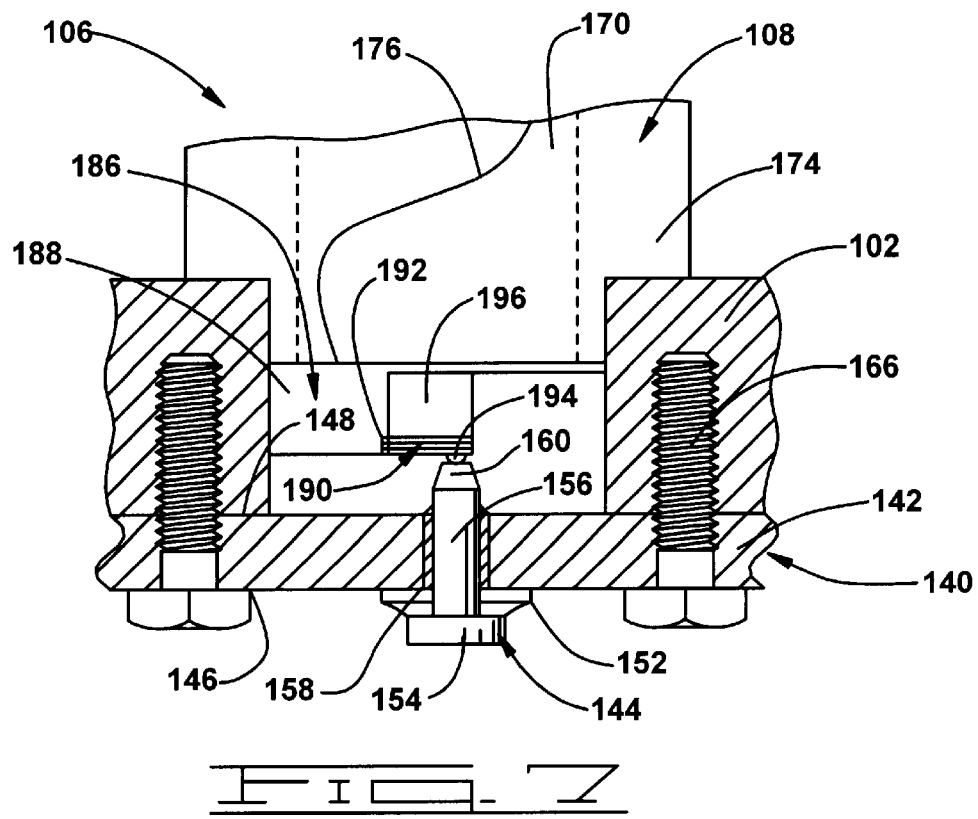
FIG. 7 is a side cross sectional view showing the interconnection of the secondary side electrical contact of FIG. 3 with a second preferred embodiment of the connector of the spindle motor of FIG. 1.

Referring now to FIG. 7, shown therein is a side cross-sectional view of a second preferred apparatus for providing an electrical interconnection between the PCBA 140 and the spindle motor 108. A padded flexible circuit connector 186 is retained by the base portion 174 of the spindle motor 108 and includes a dielectric frame member 188 that retains a flexible circuit 190. The padded flexible circuit connector 186 receives the distal end 160 of the pin 144 in electrical communication.

The flexible circuit 190 comprises a plurality of conductive traces embedded in a flexible dielectric housing (not separately designated). The flexible circuit 190 includes a captured end 192 and a contact point 194. The captured end 192 of the flexible circuit 190 is rigidly retained by the frame member 188. The contact point 194 comprises a conductive surface that is directly connected to the conductive traces within the flexible circuit 190. Disc drive designers have found that cleaned solder balls make suitable contact points 194. Alternative contact points 194 include conductive posts and exposed conductive traces.

The contact point 190 rests upon an elastomeric pad 196 that is rigidly affixed to the frame member 188. In a preferred embodiment, the elastromeric pad 196 is fabricated from closed-cell foam or other suitable plastic. The material of construction for the elastomeric pad 196 should be chosen with regard to elasticity and electrical insulation. During installation of the PCB 142 and during operation of the disc drive 100, the elastomeric pad 196 controls the contact force applied by the pin 144. The cushioning provided by the elastomeric pad 196 reduces the occurrence of damage to the pin 144 and flexible circuit 190. Although FIG. 7 makes reference to the spindle motor 108, the pin-and-padded flexible circuit combination could be used to interconnect the PCB with other components internal to the HDA 106, such as, for example, the flex assembly 134.

Figure 8:
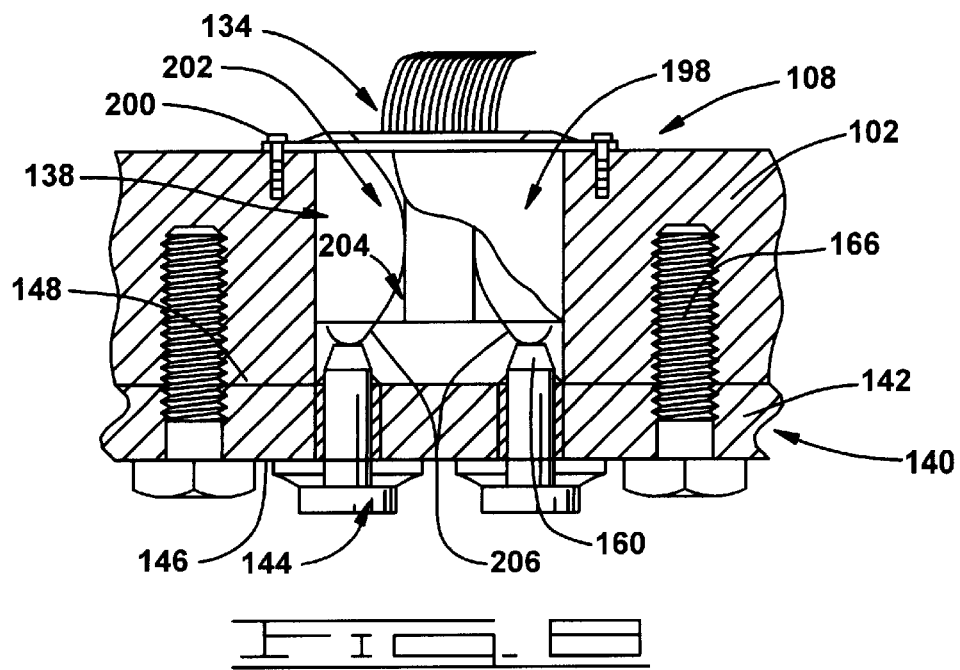
FIG. 8 is a front cross sectional view showing the interconnection of a plurality of secondary side electrical contacts with the receptacle of a flex circuit assembly.

Turning now to FIG. 8, shown therein is a side cross-sectional view of a preferred interconnection between the PCBA 140 and the flex assembly 134. The flex assembly 134 includes a spring-flexure connector 198 that is secured within a connector aperture 138 within the basedeck 102. Preferably, the spring-flexure connector 198 is secured to the basedeck 102 with screws 200.

The spring-flexure connector 198 includes a plurality of pin cavities 202 which each connect a unique pin 144 with an embedded wire 204. A front view of the spring-flexure connector 198 would reveal a second set of pin cavities 202 and embedded wires 204 adjacent to the first. Although the spring-flexure connector in FIG. 8 contemplates fourteen signal paths, it will be understood that the actual number required depends upon the specific application.

It should be noted that the spring-flexure connector 198 is an alternate configuration of the spring-flexure connector 172 shown in FIGS. 5–6 above. However, in contrast to the first configuration of the spring-flexure connector 172, the spring-flexure connector 198 makes use of a curvilinear conductive flexure 206 that contacts the pin 144 along a side portion of the pin 144. Unlike the configuration disclosed in FIGS. 5–6, the conductive flexure 206 is designed to control the lateral contact force exerted by the pin 144. Because the flex circuit assembly 134 is subject to some degree of torsional deflection during movement of the actuator assembly 114, it is desirable that the connector tolerate some degree of lateral movement.

As mentioned above, the use of spring-flexure connectors is well known in the art of disc drive design. For example, U.S. Pat. No. 6,091,572 issued Jun. 18, 2000 to Cox teaches several alternative spring-flexure connector configurations. It should be noted that alternate configurations for the spring-flexure connector 198 could readily be adopted for use in the present invention.

Turning now to FIG. 9, shown therein is an assembly routine 208 for electrically connecting the PCB 142 to components internal to the HDA 106. The assembly routine 208 begins at step 210 by forming a pin aperture through the printed circuit board 142. Preferably, the pin aperture is a plated through-hole 158 (FIG. 2). To ensure a tight fit, the diameter of the pin aperture should be marginally larger than the diameter of the pin 144. The assembly routine 208 continues at step 212 by forming a corresponding connector aperture 138 through the basedeck 102. The size, shape and orientation of the connector aperture 138 is dependent upon a number of design factors, including the dimensions of the corresponding connector. To ensure facilitated installation, the location of the connector aperture 138 should be selected for mating engagement with the plated through-hole 158.

At step 214, a connector is placed and secured within the connector aperture 138 in the basedeck 102. The connector is preferably a spring-flexure connector 172, 198 (FIGS. 5 and 8) or a padded flexible circuit connector 186 (FIG. 7). As detailed above, the connector can be secured within the connector aperture 138 by any suitable means, including screws 200 (FIG. 8) or as part of the spindle motor 108 base portion 174 (FIG. 5).

Next, at step 216, a conductive pin 144 is placed through the primary side 146 of the PCB 142. The proximal end 154 of the pin 144 should rest on solder pads 152 on the primary side 146. The distal end 160 of the pin 144 should extend a selected distance beyond the secondary side 148 of the PCB. The amount of pin 144 protrusion beyond the secondary side 148 is application-dependent and may be varied with alternate pin 144 lengths or spacers 164 (FIG. 4). If a plurality of pins 144 are required, the pins 144 are typically ganged together with a pin block 162 thereby facilitating automated installation.

At step 218, the pin or pins 144 are secured within the plated through-hole 158 through the application of heat to the solder pads 152. Heat can be supplied by any means useable in surface mount device printed circuit board production. Commonly, directed infrared radiation (IR) is used to melt the solder pads 152. For a proper electrical and mechanical connection, a portion of the solder should "wick" down the plated through-hole 158 onto the secondary side 148. It is significant that no secondary side operations are required during manufacture.

The assembly routine 208 continues at step 220 by mounting the PCB 142 onto the exterior surface of the basedeck 102 and thereby inserting the distal end 160 of the pin 144 into the connector. The PCB 142 can be secured to the basedeck using any conventional means, such as, for example, mounting screws 166 (FIG. 7). Preferably, a vibro-acoustic pad is placed between the PCB 142 and the basedeck 102. The process then ends at step 222.

The foregoing preferred embodiments have utilized pins 144 each having a substantially flat electrical contact surface 160 at the distal extent of the pin. Alternative preferred configurations for the electrical contact surface will now be briefly discussed.

FIG. 10 illustrates a pointed electrical contact surface 224 which is substantially cone-shaped and which converges to a point 226. FIG. 11 provides a convex electrical contact surface 228 having a substantially rounded, or spherical shape. FIG. 12 illustrates a concave electrical contact surface 230 which extends into the body of the pin 144, as further shown in the cross-sectional view of FIG. 13. The selection of a particular configuration of the electrical contact surface, of course, will depend upon the requirements of a given application.

In view of the foregoing, it will be recognized that the present invention is directed to an interconnection assembly for completing an electronic signal path between a printed circuit board (such as 142) and an internal component (such as spindle motor 108 or flex assembly 134) within a head disc assembly (such as 106) of a disc drive (such as 100). The printed circuit board has a primary side (such as 146) suitable for mounting surface mount devices (such as 150) and a secondary side (such as 148) facing a basedeck (such as 102) of the disc drive 100.

The interconnection assembly comprises a conductive pin (such as 144) provisioned within a pin aperture (such as 158) and a connector (such as 172, 186) provisioned within a connector aperture (such as 138). The pin 144 is inserted and secured within the pin aperture 158 using primary side 146 operations. A distal end (such as 160) of the conductive pin is inserted into the connector while mounting the printed circuit board to the head disc assembly.

The present invention is also directed to a method for electrically connecting the printed circuit board 142 to components internal to the head disc assembly 106 (such as routine 208). The method includes forming the pin aperture 158 through the printed circuit board 142 (such as step 210) and forming the corresponding connector aperture 138 through the basedeck 102 (such as step 212). The method also includes placing the connector 172, 186 within the connector aperture 138 (such as step 214) and affixing the conductive pin 144 within the pin aperture 158 (such as step 216).

It will be clear that the present invention is well adapted to attain the ends and advantages mentioned as well as those inherent therein. While a presently preferred embodiment has been described for purposes of this disclosure, numerous changes may be made which will readily suggest themselves to those skilled in the art and which are encompassed in the spirit of the invention disclosed and as defined in the appended claims.

What is claimed is:

1. In a disc drive having a head disc assembly (HDA) and a printed circuit board (PCB) mounted to the HDA, the HDA comprising a basedeck having an exterior surface, the PCB having a primary side supporting control electronics for the disc drive and a secondary side facing the basedeck exterior surface, a method for interconnecting an internal component housed within the HDA with a conductive trace on the PCB, comprising steps of:

providing the PCB with a pin aperture having a circumferentially extending side wall and a central axis; and inserting, from the primary side, a conductive pin through the pin aperture in a direction along the central axis so that a distal end of the pin projects beyond the secondary side of the PCB, the distal end comprising an electrical contact surface provisioned at the distal extent of the pin and which intersects the central axis, the electrical contact surface configured to pressingly engage a connector disposed in a connector aperture in the basedeck.

2. The method of claim 1, wherein the method comprises an additional step of:

mounting the PCB to the basedeck exterior surface, thereby bringing the electrical contact surface into pressing engagement with the connector.

3. The method of claim 1, further comprising a step of electrically and mechanically affixing a proximal end of the pin to the primary side of the PCB.

4. The method of claim 1, wherein the connector of the inserting step comprises a conductive flexure which intersects the central axis and which deflects upon contact with the electrical contact surface at the distal end of the conductive pin.

5. The method of claim 1, wherein the connector of the inserting step comprises:

a conductive conduit surrounded by a flexible dielectric;

a contact piece for placing the conductive conduit and the conductive pin in electrical communication; and an elastomeric pad supporting the flexible dielectric.

6. The method of claim 1, wherein the internal component is a spindle motor.

7. The method of claim 6, wherein the spindle motor has a shaft aligned with the connector aperture, and the connector is disposed within the shaft.

8. The method of claim 1, wherein the internal component is a flex circuit assembly useable for the transfer of data between the head disc assembly and the printed circuit board.

9. The method of claim 1, wherein the electrical contact surface at the distal end of the conductive pin is plated in gold or a lead/tin alloy.

10. The method of claim 1, wherein the electrical contact surface at the distal end of the conductive pin is concave.

11. The method of claim 1, wherein the inserting step results in the electrical contact surface located a first distance from the secondary side of the PCB along the central axis, and wherein the first distance is less than an axial length of the pin aperture.

12. The method of claim 1, wherein the conductive pin of the inserting step comprises an annular flange which radially extends from a proximal end of the pin, the annular flange having a diameter greater than a diameter of the pin aperture.

13. The method of claim 12, wherein the inserting step further comprises bringing the annular flange into a contacting relationship with the primary side of the PCB so that the annular flange prevents further extension of the pin through the pin aperture.

14. In a disc drive having a head disc assembly and a printed circuit board mounted to the head disc assembly, the head disc assembly comprising a basedeck having an exterior surface, the printed circuit board having a primary side supporting control electronics for the disc drive and a secondary side facing the basedeck exterior surface, an interconnection assembly for interconnecting an internal component housed within the head disc assembly with a conductive trace on the printed circuit board, comprising:

a pin aperture through the printed circuit board;

a corresponding connector aperture through the basedeck;

a connector within the connector aperture; and a conductive pin within the pin aperture, the conductive pin having a proximal end electrically and rigidly connected to the primary side of the printed circuit board, a medial portion extending through the pin aperture and beyond the secondary side of the printed circuit board, and a distal end extending into the connector aperture, the distal end having an electrical contact surface at the distal extent of the pin and through which a central axis of the pin aperture extends, the electrical contact surface pressingly engaging the connector.

15. The interconnection assembly of claim 14, wherein the pin aperture comprises an electrically conductive plated through-hole.

16. The interconnection assembly of claim 14, wherein the connector comprises a conductive flexure which deflects upon contact with the electrical contact surface of the distal end of the conductive pin.

17. The interconnection assembly of claim 14, wherein the connector comprises:

a conductive conduit surrounded by a flexible dielectric;

a contact piece for placing the conductive conduit and the conductive pin in electrical communication; and an elastomeric pad supporting the flexible dielectric.

18. The interconnection assembly of claim 14, wherein the internal component is a spindle motor.

19. The interconnection assembly of claim 18, wherein the spindle motor has a shaft aligned with the connector aperture, and the connector is disposed within the shaft.

20. The interconnection assembly of claim 14, wherein the internal component is a flex circuit assembly useable for the transfer of data between the head disc assembly and the printed circuit board.

21. The interconnection assembly of claim 14, wherein the electrical contact surface of the distal end of the conductive pin is plated in gold or a lead/tin alloy.

22. The interconnection assembly of claim 14, wherein the electrical contact surface of the distal end of the conductive pin is concave.

23. The interconnection assembly of claim 14, wherein the electrical contact surface at the distal end of the conductive pin is convex.

24. The interconnection assembly of claim 14, wherein the electrical contact surface at the distal end of the conductive pin is substantially flat so as to extend substantially normal to the central axis.

25. The interconnection assembly of claim 14, wherein the electrical contact surface at the distal end of the conductive pin converges substantially to a point.

26. The interconnection assembly of claim 14, wherein the electrical contact surface is located a first distance from the secondary side of the PCB along the central axis, and wherein the first distance is less than an axial length of the pin aperture.

27. The interconnection assembly of claim 14, wherein the conductive pin is inserted from the primary side into the pin aperture.

28. The interconnection assembly of claim 27, wherein the conductive pin further comprises an annular flange which radially extends from the proximal end, the annular flange having a diameter greater than a diameter of the pin aperture.

29. The interconnection assembly of claim 27, wherein the annular flange is brought into a contacting relationship with the primary side of the PCB so that the annular flange prevents further extension of the pin through the pin aperture.

30. A disc drive comprising:

a head disc assembly having an internal component;

a printed circuit board having a conductive trace; and means for electrically connecting the internal component of the head disc assembly to the conductive trace on the printed circuit board.

* * * * *